United States Patent
Eguchi et al.

(10) Patent No.: US 7,377,026 B2
(45) Date of Patent: May 27, 2008

(54) METHOD OF MAKING CURRENT-PERPENDICULAR-TO-THE-PLANE STRUCTURE MAGNETORESISTIVE ELEMENT

(75) Inventors: Shin Eguchi, Kawasaki (JP); Chikayoshi Kamata, Kawasaki (JP); Junya Ikeda, Kawasaki (JP); Atsushi Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 34 days.

(21) Appl. No.: 11/431,757

(22) Filed: May 10, 2006

(65) Prior Publication Data

US 2006/0191130 A1     Aug. 31, 2006

Related U.S. Application Data

(62) Division of application No. 10/027,651, filed on Dec. 20, 2001, now Pat. No. 7,092,223.

(30) Foreign Application Priority Data

May 2, 2001    (JP)    ............... 2001-134973

(51) Int. Cl.
    *G11B 5/187*    (2006.01)
(52) U.S. Cl. ............... 29/603.18; 29/603.12; 29/603.14; 29/603.15; 216/22
(58) Field of Classification Search ............ 29/603.18, 29/603.12, 603.13, 603.14, 603.15, 603.16; 360/324.12, 313, 317; 216/22
See application file for complete search history.

(56) References Cited

U.S. PATENT DOCUMENTS 5,729,410 A    3/1998    Fontana et al.
6,151,193 A *  11/2000   Terunuma et al. ...... 360/317 X
6,621,666 B2   9/2003    Miyauchi et al.

FOREIGN PATENT DOCUMENTS

| JP | 07-296340 | 11/1995 |
|----|-----------|---------|
| JP | 10-163544 | 6/1998 |
| JP | 10-163545 | 6/1998 |
| JP | 11-175925 | 7/1999 |
| JP | 11-232615 | 8/1999 |
| JP | 11-296815 | 10/1999 |
| JP | 11-296821 | 10/1999 |
| JP | 2000-076627 | 3/2000 |
| JP | 2000-348311 | 12/2000 |
| JP | 2001-298227 | * 10/2001 |

* cited by examiner

*Primary Examiner*—A. Dexter Tugbang
(74) *Attorney, Agent, or Firm*—Greer, Burns & Crain, Ltd.

(57) ABSTRACT

A magnetoresistive film is formed on the surface of a lower electrode layer in a method of making a current-perpendicular-to-the-plane structure magnetoresistive element. The magnetoresistive film includes a lower portion and an upper portion overlaid on the lower portion. The lower portion includes at least a pinned magnetic layer. The upper portion includes at least a free magnetic layer. A pair of domain control magnetic layers is formed to sandwich the magnetoresistive film. An insulator film is formed to cover over the domain control magnetic layers. The upper portion is subjected to an etching process. The domain control magnetic layers are reliably prevented from being removed during the etching process. Accordingly, the domain control magnetic layers are allowed to reliably sandwich the upper portion of the magnetoresistive film in the aforementioned manner.

6 Claims, 6 Drawing Sheets

METHOD OF MAKING CURRENT-PERPENDICULAR-TO-THE-PLANE STRUCTURE MAGNETORESISTIVE ELEMENT

This is a Divisional of Application Ser. No. 10/027,651, filed Dec. 20, 2001, now U.S. Pat. No. 7,092,223.

BACKGROUND OF THE INVENTION

1. Field of the Invention

The present invention relates to a magnetoresistive element often utilized in a magnetic recording medium drive such as a magnetic disk drive as well as a magnetic tape drive. In particular, the invention relates to a current-perpendicular-to-the-plane (CPP) structure magnetoresistive element comprising: the lower portion of a magnetoresistive film extending over the surface of a lower magnetic pole layer by a first lateral width; the upper portion of the magnetoresistive film extending over the surface of the lower portion by a second lateral width smaller than the first lateral width; and an upper magnetic pole layer contacting the upper portion of the magnetoresistive film, and a method of making the same.

2. Description of the Prior Art

A magnetoresistive film, such as a spin valve film, usually includes a pinning antiferromagnetic layer, a pinned ferromagnetic layer and a non-magnetic intermediate layer for the lower portion of the magnetoresistive film. The magnetoresistive film further includes the upper portion including a free ferromagnetic layer extending over the surface of the non-magnetic intermediate layer. In the technical field of CPP structure magnetoresistive elements, the upper portion is often reduced in the width in the lateral direction of a recording track as compared with the lower portion in the magnetoresistive film. The upper portion is interposed between insulator layers on the lower portion. The insulator layers serves to establish a narrower path for electric current between the lower portion of the magnetoresistive film and the upper magnetic pole layer. The substantial width in the lateral direction can be reduced in the magnetoresistive film.

The upper portion is carved out of a layered material on the lower portion in the magnetoresistive film. A pair of domain control magnetic layers, namely, biasing hard magnetic layers are subjected to an etching process on the laterally opposite ends of the upper portion of the magnetoresistive film. The level of the domain control magnetic layers gets lowered to the level of the upper surface of the lower portion. The upper portion of the magnetoresistive film gets completely out of the space between the domain control magnetic layers. The longitudinal biasing magnetic field induced between the domain control magnetic layers cannot act enough over the free ferromagnetic layer in the upper portion of the magnetoresistive film. The Barkhausen noise cannot be reduced enough.

SUMMARY OF THE INVENTION

It is accordingly an object of the present invention to provide a current-perpendicular-to-the-plane (CPP) structure magnetoresistive element expected to contribute to reduction in the Barkhausen noise, and a method of making the same.

According to the present invention, there is provided a current-perpendicular-to-the-plane (CPP) structure magnetoresistive (MR) element comprising: a lower portion of a magnetoresistive film extending over the surface of a lower electrode layer by a first width in the lateral direction; an upper portion of the magnetoresistive film extending over the surface of the lower portion by a second width smaller than the first width in the lateral direction; insulators sandwiching the upper portion of the magnetoresistive film in the lateral direction; domain control magnetic layers sandwiching the upper portion of the magnetoresistive film and the insulators in the lateral direction; and an upper electrode layer contacting the upper portion of the magnetoresistive film.

The insulators serve to establish a narrower path for electric current between the lower portion of the magnetoresistive film and the upper electrode layer in the CPP structure MR element. The substantial width in the lateral direction of a recording track can thus be reduced in the magnetoresistive film. The CPP structure MR element is expected to contribute to an improved recordation density for a magnetic recording medium.

In addition, not only the lower portion but also the upper portion of the magnetoresistive film can be disposed in a space between the domain control magnetic layers. It is highly expected that a longitudinal biasing magnetic field established between the domain control magnetic layers efficiently acts on the magnetoresistive film. In particular, if a free magnetic layer is included in the upper portion of the magnetoresistive film, the free magnetic layer can be subjected to a larger longitudinal biasing magnetic field in the CPP structure MR element. A single domain property can be realized in the free ferromagnetic layer enough. The Barkhausen noise can be reduced.

In this case, the insulators are preferably made of a magnetic insulator material. The magnetic property of the insulators serves to establish the magnetization in the insulators. It is highly expected that a longitudinal biasing magnetic field established between the domain control magnetic layers more efficiently acts on the magnetoresistive film. In particular, if a free magnetic layer is included in the upper portion of the magnetoresistive film, the free magnetic layer can be subjected to a still larger longitudinal biasing magnetic field in the CPP structure MR element. A single domain property can reliably be realized in the free ferromagnetic layer. The Barkhausen noise can be reduced.

There may be provided a method of making the aforementioned CPP structure MR element, comprising: forming a magnetoresistive film on a surface of a lower electrode layer; forming a pair of domain control magnetic layers sandwiching the magnetoresistive film; forming an insulator film covering over the domain control magnetic layers; and subjecting an upper surface of the magnetoresistive film to an etching process.

The insulator film functions as protection layer for the domain control magnetic layers during the etching process in this method. The domain control magnetic layers are thus reliably prevented from being removed during the etching process. Accordingly, the domain control magnetic layers are allowed to reliably sandwich the upper portion of the magnetoresistive film in the aforementioned manner.

The insulator film remains on the domain control magnetic layers after the etching process. When the upper portion is to be formed in the aforementioned method, grooves may be formed between the magnetoresistive film and the respective domain control magnetic layers based on the etching process. The grooves may be filled with the insulators.

BRIEF DESCRIPTION OF THE DRAWINGS

The above and other objects, features and advantages of the present invention will become apparent from the following description of the preferred embodiment in conjunction with the accompanying drawings, wherein.

DESCRIPTION OF THE PREFERRED EMBODIMENT

Figure 1:
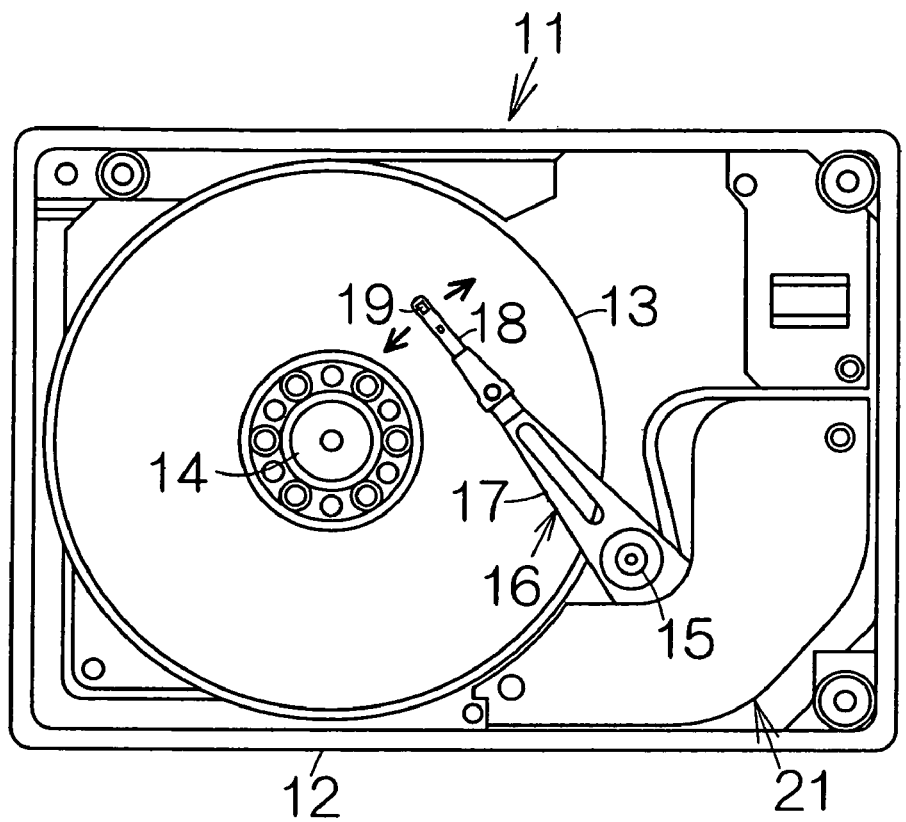
FIG. 1 is a plan view schematically illustrating the structure of a hard disk drive (HDD)

FIG. 1 schematically illustrates the interior structure of a hard disk drive (HDD) 11 as an example of a magnetic recording medium drive or storage device. The HDD 11 includes a box-shaped primary enclosure 12 defining an inner space of a flat parallelepiped, for example. At least one magnetic recording disk 13 is accommodated in the inner space within the primary enclosure 12. The magnetic recording disk 13 is mounted on a driving shaft of a spindle motor 14. The spindle motor 14 is allowed to drive the magnetic recording disk 13 for rotation at a higher revolution rate such as 7,200 rpm or 10,000 rpm, for example. A cover, not shown, is coupled to the primary enclosure 12 so as to define the closed inner space between the primary enclosure 12 and itself.

A carriage 16 is also accommodated in the inner space of the primary enclosure 12 for swinging movement about a vertical support shaft 15. The carriage 16 includes a rigid swinging arm 17 extending in the horizontal direction from the vertical support shaft 15, and an elastic head suspension 18 fixed to the tip end of the swinging arm 17 so as to extend forward from the swinging arm 17. As conventionally known, a flying head slider 19 is cantilevered at the head suspension 18 through a gimbal spring, not shown. The head suspension 18 serves to urge the flying head slider 19 toward the surface of the magnetic recording disk 13. When the magnetic recording disk 13 rotates, the flying head slider 19 is allowed to receive an airflow generated along the rotating magnetic recording disk 13. The airflow serves to generate a lift on the flying head slider 19. The flying head slider 19 is thus allowed to keep flying above the surface of the magnetic recording disk 13 during rotation of the magnetic recording disk 13 at a higher stability established by the balance between the lift and the urging force of the head suspension 18.

When the carriage 16 is driven to swing about the support shaft 15 during flight of the flying head slider 19, the flying head slider 19 is allowed to cross the recording tracks defined on the magnetic recording disk 13 in the radial direction of the magnetic recording disk 13. This radial movement serves to position the flying head slider 19 right above a target recording track on the magnetic recording disk 13. In this case, an electromagnetic actuator 21 such as a voice coil motor (VCM) can be employed to realize the swinging movement of the carriage 16, for example. As conventionally known, in the case where two or more magnetic recording disks 13 are incorporated within the inner space of the primary enclosure 12, a pair of the elastic head suspensions 18 are mounted on a single common swinging arm 17 between the adjacent magnetic recording disks 13.

Figure 2:
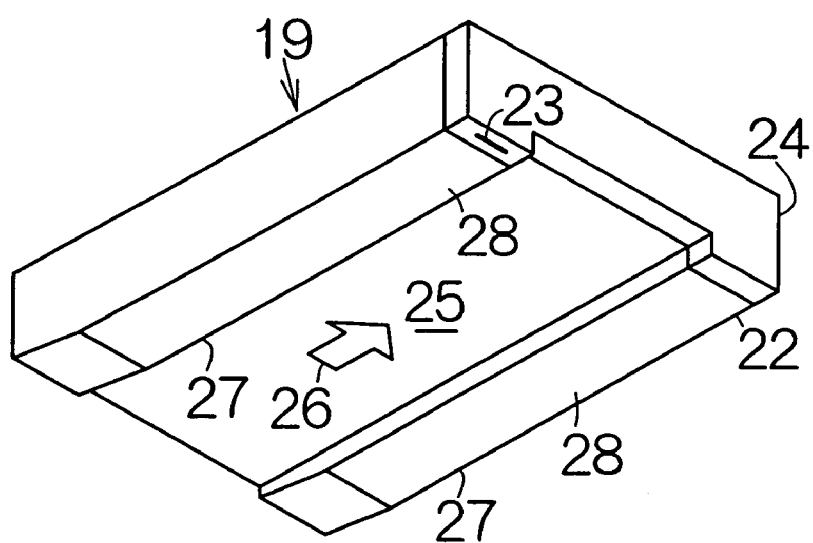
FIG. 2 illustrates an enlarged perspective view of a flying head slider according to a specific example.

FIG. 2 illustrates a specific example of the flying head slider 19. The flying head slider 19 of this type includes a slider body 22 made from $Al_2O_3$—TiC in the form of a flat parallelepiped, and a head protection layer 24 formed to spread over the trailing or downstream end of the slider body 22. The head protection layer 24 may be made of $Al_2O_3$. A read/write electromagnetic transducer 23 is embedded in the head protection layer 24. A medium-opposed surface or bottom surface 25 is defined continuously over the slider body 22 and the head protection layer 24 so as to face the surface of the magnetic recording disk 13 at a distance. The bottom surface 25 is designed to receive an airflow 26 generated along the surface of the rotating magnetic recording disk 13.

A pair of rails 27 are formed to extend over the bottom surface 25 from the leading or upstream end toward the trailing or downstream end. The individual rail 27 is designed to define an air bearing surface (ABS) 28 at its top surface. In particular, the airflow 26 generates the aforementioned lift at the respective air bearing surfaces 28. The read/write electromagnetic transducer 23 embedded in the head protection layer 24 is exposed at the air bearing surface 28 as described later in detail. However, a diamond-like-carbon (DLC) protection layer may be formed to spread over the ABS 28 so as to cover over the exposed read/write electromagnetic transducer 23. The flying head slider 19 may take any shape or form other than the above-described one.

Figure 3:
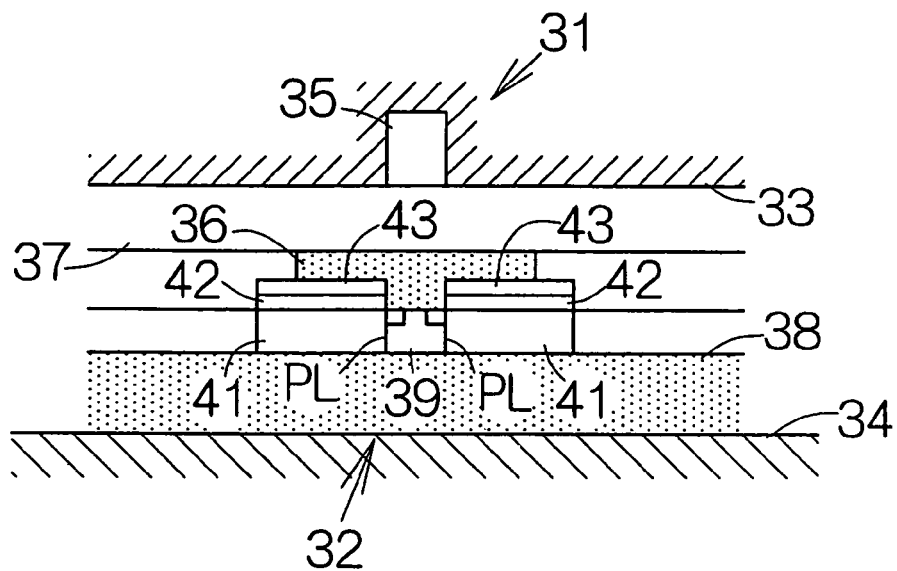
FIG. 3 is an enlarged front view of the flying head slider for illustrating a read/write electromagnetic transducer observed at the bottom surface.

FIG. 3 illustrates an enlarged detailed view of the read/write electromagnetic transducer 23 at the bottom surface 25. The read/write electromagnetic transducer 23 includes an inductive write element or a thin film magnetic head 31 and a current-perpendicular-to-the-plane (CPP) structure magnetoresistive (MR) read element 32. The inductive write element 31 is designed to write a magnetic bit data by utilizing a magnetic field induced in a conductive swirly coil pattern, not shown, for example. The CPP structure MR read element 32 is designed to read a magnetic bit data by utilizing variation in the electric resistance in response to the inversion of the magnetic polarity in a magnetic field acting from the magnetic recording disk 13. The inductive write element 31 and the CPP structure MR read element 32 are interposed between an $Al_2O_3$ (alumina) layer 33 as the overcoat film or upper half of the head protection layer 24 and an $Al_2O_3$ (alumina) layer 34 as the undercoat film or lower half of the head protection layer 24.

The inductive write element 31 includes an upper and a lower magnetic pole layer 35, 36. The front ends of the upper and lower magnetic pole layers 35, 36 are exposed at the ABS 28. The upper and lower magnetic pole layers 35, 36 may be made of FeN, NiFe, or the like, for example. The upper and lower magnetic pole layers 35, 36 cooperate to provide a magnetic core of the inductive write element 31.

A non-magnetic gap layer 37 is interposed between the upper and lower magnetic pole layers 35, 36. The non-magnetic gap layer 37 may be made of $Al_2O_3$ (alumina), for example. As conventionally known, when a magnetic field is induced at the conductive swirly coil pattern, a magnetic flux is exchanged between the upper and lower magnetic pole layers 35, 36. The non-magnetic gap layer 37 allows the exchanged magnetic flux to leak out of the bottom surface 25. The thus leaked magnetic flux forms a magnetic field for recordation, namely, a write gap magnetic field.

The CPP structure MR read element 32 includes a lower electrode layer 38 extending over the upper surface of the alumina layer 34, namely, a substratum. The lower electrode layer 38 may have not only the electric conductivity but also the soft magnetic property. If the lower electrode layer 38 is made of an electrically conductive soft magnetic, such as NiFe, for example, the lower electrode layer 38 is allowed to function as the lower shield layer for the CPP structure MR read element 32.

An electromagnetic transducer film or magnetoresistive (MR) film 39 is formed to extend over the upper surface of the lower electrode layer 38 along the ABS 28. Likewise, a pair of domain control magnetic layers or biasing hard magnetic layers 41 are formed to extend over the upper surface of the lower electrode layer 38 along the ABS 28. The domain control magnetic layers 41 are allowed to sandwich the magnetoresistive film 39 on the lower electrode layer 38 along the ABS 28. The domain control magnetic layers 41 may be made of a metallic material such as CoPt, CoCrPt, or the like, for example. A magnetization can be established in the domain control magnetic layers 41 in the specific direction across the magnetoresistive film 39. When a biasing magnetic field is induced based on the magnetization in the domain control magnetic layers 41, a single domain property can be realized in a free ferromagnetic layer within the magnetoresistive film 39. The structure of the magnetoresistive film 39 will be described later in detail.

First insulator layers 42 are formed to extend over the upper surfaces of the domain control magnetic layers 41. The first insulator layer 42 is allowed to spread only over the corresponding domain control magnetic layer 41. Specifically, the individual first insulator layer 42 is terminated at a vertical plane PL including the boundary between the magnetoresistive film 39 and the corresponding domain control magnetic layer 41. The first insulator layers 42 may be made of an insulator material such as $Al_2O_3$, $SiO_2$, or the like.

The first insulator layers 42 are covered with second insulator layers 43, respectively. The second insulator layers 43 may extend not only over the first insulator layers 42 but also over the lower electrode layer 38. The individual second insulator layer 43 is terminated at the vertical plane PL in the same manner as the first insulator layers 42. The second insulator layers 43 may be made of an insulator material such as $Al_2O_3$, $SiO_2$, or the like. The second insulator layers 43 may be connected to each other behind the lower magnetic pole layer 36.

The lower magnetic pole layer 36 of the inductive write element 31 is allowed to extend over the upper surface of the second insulator layers 43. The lower magnetic pole layer 36 is received on the top surface of the magnetoresistive film 39 between the vertical planes PL. Specifically, the lower magnetic pole layer 36 is allowed to function as the upper electrode layer of the CPP structure MR read element 32. An electric current can be supplied to the magnetoresistive film 39 through the lower electrode layer 38 and the lower magnetic pole layer 36. In addition, the lower magnetic pole layer 36 is also allowed to function as the upper shield layer for the CPP structure MR read element 32.

Figure 4:
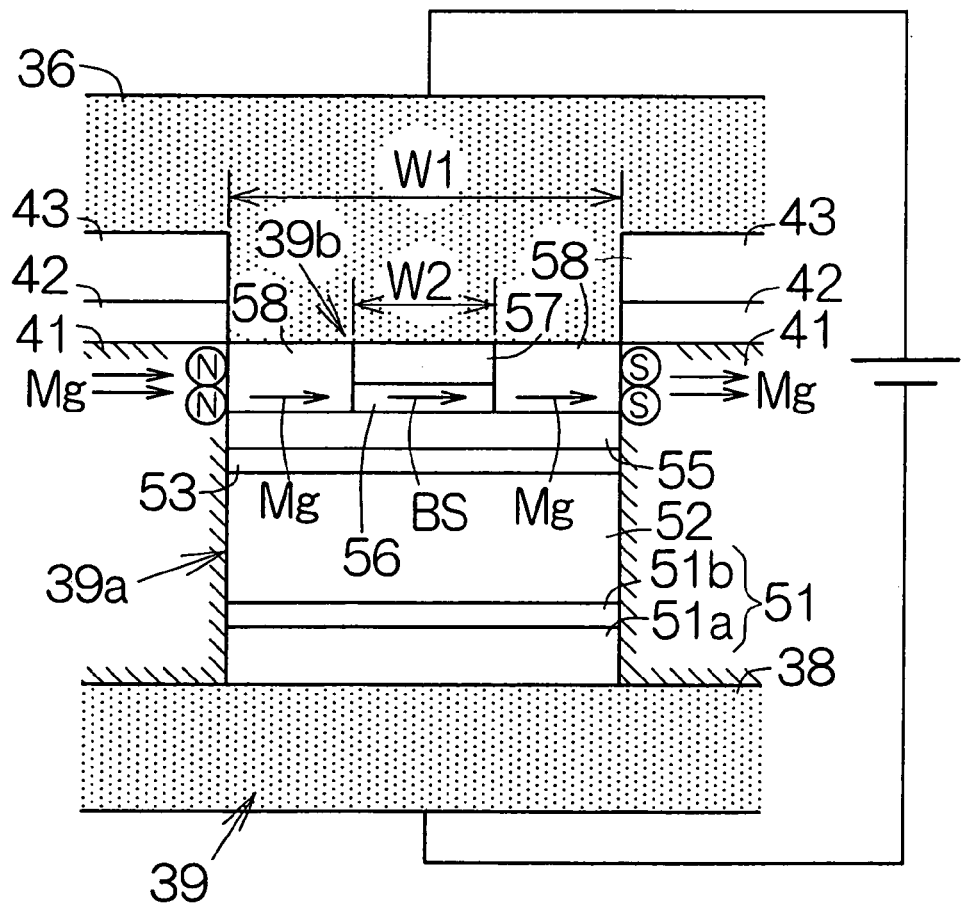
FIG. 4 is an enlarged partial front view illustrating in detail the structure of a magnetoresistive (MR) film according to a specific example.

As shown in FIG. 4, the magnetoresistive film or layered-structure 39 is a so-called spin valve film, for example. The spin valve film includes a substratum 51, an antiferromagnetic layer 52 as a pinning layer, a pinned ferromagnetic layer 53, and a non-magnetic intermediate layer 55, sequentially superposed one another, for the lower portion 39a of the magnetoresistive film 39. The spin valve film further includes the upper portion 39b of the magnetoresistive film 39, including a free ferromagnetic layer 56 and a protection layer 57, superposed on the upper surface of the non-magnetic intermediate layer 55. The antiferromagnetic layer 52 serves to fix the magnetization in the pinned ferromagnetic layer 53 in a specific direction. Here, the substratum 51 may include a Ta layer 51a, and an NiFe layer 51b superposed on the upper surface of the Ta layer 51a. For example, the antiferromagnetic layer 52 may be made of an antiferromagnetic material such as FeMn, PdPtMn, or the like. The pinned ferromagnetic layer 53 as well as the free ferromagnetic layer 56 may be made of a ferromagnetic material such as $Co_{90}Fe_{10}$ or the like. The non-magnetic intermediate layer 55 may be made of an electrically conductive material such as Cu or the like. The protection layer 57 may include a Cu layer, and a cap layer or Ta layer formed to extend over the upper surface of the Cu layer, for example.

In this case, a first width W1 of the upper portion 39b in the lateral direction of a recording track is set smaller than a second width W2 of the lower portion 39a in the lateral direction in the magnetoresistive film 39. Accordingly, the lower portion 39a contacts the respective domain control magnetic layers 41 at the vertical planes PL. On the other hand, spaces are defined between the upper portion 39b and the vertical planes PL, namely, the domain control magnetic layers 41. The spaces are filled with insulators 58. The domain control magnetic layers 41 are thus allowed to sandwich the upper portion 39b of the magnetoresistive film 39 and the insulators 58 in the lateral direction of a recording track on the magnetic recording disk 13. The insulators 58 serve to establish a narrower path for an electric current between the lower portion 39a and the upper electrode layer or lower magnetic pole layer 36. The substantial width in the lateral direction can be reduced in this manner in the magnetoresistive film 39. It should be noted that the first and second lateral width W1, W2 may be measured in parallel with the surface of the lower electrode layer 38 along the ABS 28.

When the CPP structure MR read element 32 is opposed to the surface of the magnetic recording disk 13 for reading a magnetic information data, the magnetization of the free ferromagnetic layer 56 is allowed to rotate in the spin valve film in response to the inversion of the magnetic polarity applied from the magnetic recording disk 13, as conventionally known. The rotation of the magnetization in the free ferromagnetic layer 56 induces variation in the electric resistance of the spin valve film. When a sensing current is supplied to the spin valve film through the lower magnetic pole layer 36 and the lower electrode layer 38, a variation in voltage appears in the sensing current in response to the variation in the magnetoresistance. The variation in voltage can be utilized to detect a magnetic bit data recorded on the magnetic recording disk 13. Since a narrower path for the sensing current can be established in the magnetoresistive film 39 in the aforementioned manner, the spin valve film is allowed to exhibit a higher sensitivity to the magnetic field applied from the magnetic recording disk 13.

When a magnetization Mg is established in the domain control magnetic layers 41 in the CPP structure MR read element 32, a longitudinal biasing magnetic field BS can be established, from one of the domain control magnetic layers 41 to the other 41, based on the magnetic charges generated at the end surfaces of the domain control layers 41. In particular, since the free ferromagnetic layer 56 in the upper portion 39b is disposed in a space between the domain control magnetic layers 41, the free ferromagnetic layer 56 is allowed to receive the longitudinal biasing magnetic field BS enough. A single domain property can be realized in the free ferromagnetic layer 56 enough. The Barkhausen noise can be reduced.

In this case, the insulators 58 are preferably made of a magnetic insulator material. As is apparent from FIG. 4, the magnetic property of the insulators 58 serves to establish the magnetization Mg in the insulators 58. Accordingly, a single domain property can more reliably be established in the free ferromagnetic layer 56. The magnetic insulator material may be represented by an alloy such as Co-γFe$_2$O$_3$, having the resistivity of 2.0 Ωcm. In general, the magnetic material for the pinned ferromagnetic layer 53 as well as the free ferromagnetic layer 56 exhibits the resistivity smaller than 100 μΩcm, while the magnetic material for the antiferromagnetic layer 52 exhibits the resistivity around 200 μΩcm.

Figure 5:
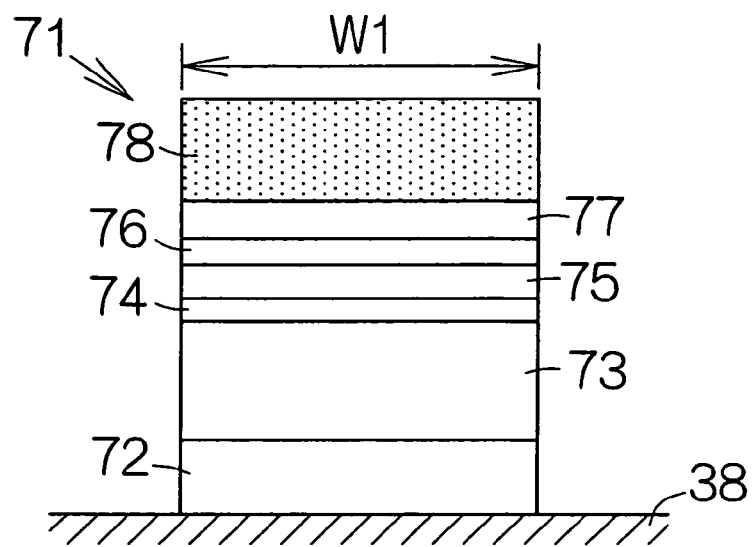
FIG. 5 is an enlarged partial sectional view of a wafer schematically illustrating a layered-material for the magnetoresistive film on a lower electrode layer.

Next, a brief description will be made on a method of making the CPP structure MR read element 32. First of all, a wafer, not shown, made of Al$_2$O$_3$—TiC is prepared. The alumina layer 34 is formed over the surface of the wafer. The lower electrode layer 38 is then formed on the alumina layer 34. A layered-material 71 of the first lateral width W1 is then formed on the exposed surface of the lower electrode layer 38, as shown in FIG. 5. The layered-material 71 may be shaped out of layers, having the structure identical to that of the spin valve film, uniformly formed over the wafer. Specifically, the layered-material 71 includes a substratum 72, an antiferromagnetic layer 73, a pinned ferromagnetic layer 74, a non-magnetic intermediate layer 75, a free ferromagnetic layer 76 and a protection layer 77 in this sequence from the bottom. A photoresist film 78 is employed to shape the layered-material 71 out of the layers.

Figure 6:
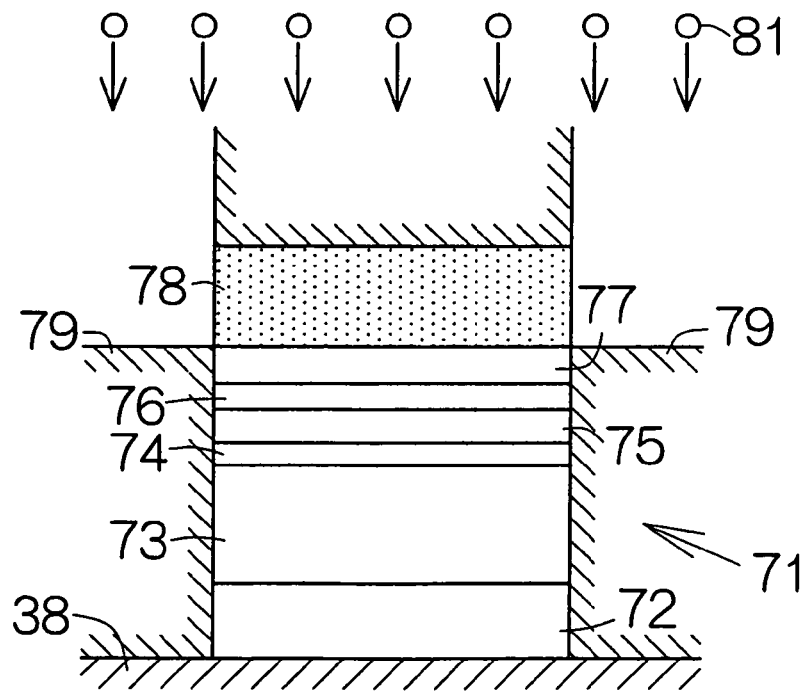
FIG. 6 is an enlarged partial sectional view of the wafer schematically illustrating the process of forming hard magnetic material layers, corresponding to domain control magnetic layers, sandwiching the layered-material.

As shown in FIG. 6, hard magnetic material layers 79, corresponding to the domain control magnetic layers 41, are then formed to sandwich the layered-material 71 on the wafer. Sputtering is utilized to supply magnetic materials or particles 81 over the exposed surface of the lower electrode layer 38 from the above, for example. The magnetic materials 81 are cumulated on the exposed surface of the lower electrode layer 38 as well as on the photoresist film 78. When the side walls of the layered-material 71 have completely been covered with the magnetic materials 81, the hard magnetic material layers 79 can be obtained.

Figure 7:
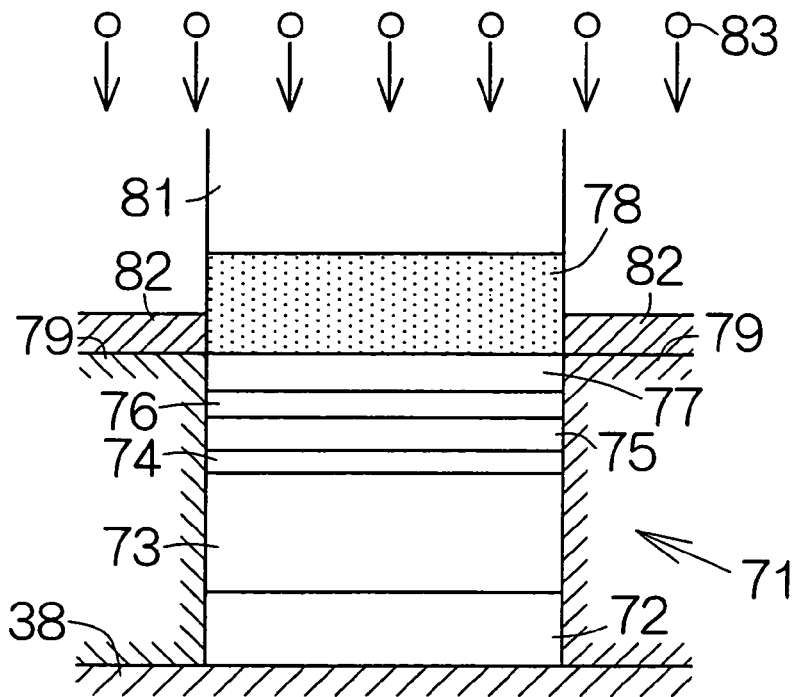
FIG. 7 is an enlarged partial sectional view of the wafer schematically illustrating the process of forming a first insulating material layer corresponding to first insulator layers.

A first insulating material layer 82, corresponding to the first insulator layers 42, is then formed on the wafer, as shown in FIG. 7. Sputtering is employed to supply insulator materials or particles 83 over the cumulated magnetic materials 81 from the above, for example. The insulator materials 83 are cumulated over the hard magnetic material layers 79 as well as the photoresist film 78. Formation of the first insulator layers 42 or first insulating material layer 82 can be realized on the hard magnetic material layers 79 in this manner. A lift-off is thereafter conducted. Specifically, the magnetic materials 81 and the insulator materials 83 on the photoresist film 78 are removed in response to removal of the photoresist film 78.

Figure 8:
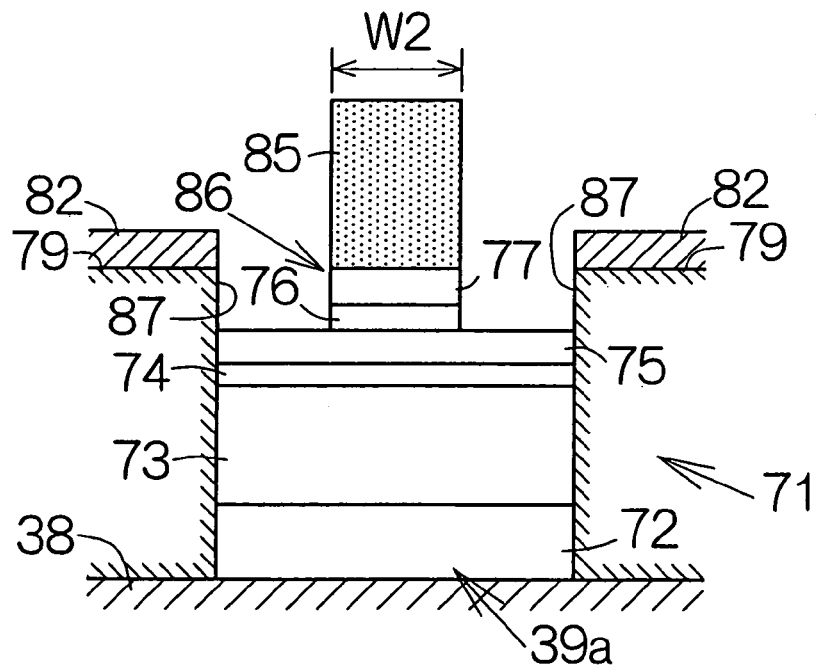
FIG. 8 is an enlarged partial sectional view of the wafer schematically illustrating the process of carving the upper portion out of the layered-material.

When the first insulating material layer 82 has been formed on the hard magnetic material layers 79 in the above-described manner, the layered-material 71 is subjected to an etching process. As shown in FIG. 8, a photoresist film 85 of the second lateral width W2 is formed on the layered-material 71. The photoresist film 85 is designed to define the shape of the upper portion 39b of the magnetoresistive film 39. The photoresist film 85 is spaced from the respective first insulating material layers 82 in the lateral direction in a specific manner. When a dry etching process such as ion milling is effected, the protection layer 77 and the free ferromagnetic layer 76 are removed from the layered-material 71 over the area surrounding the photoresist film 85. The upper portion 86 of the layered-material 71 is thus shaped out in this manner. After the etching process, grooves 87 have been formed between the layered-material 71 and the respective hard magnetic material layers 79 adjacent the upper portion 86. The grooves 87 serve to expose the upper surface of the non-magnetic intermediate layer 75 in the layered-material 71.

In the etching process, the thickness t[nm] of the first insulating material layer 82 is set in accordance with the following equation:

[Equation 1]

$$t = R \cdot s \qquad (1)$$

Here, the constant R represents the etching rate [nm/sec] for the first insulating material layer 82. The constant s[sec] represents the duration of the etching process until the non-magnetic intermediate layer 75 gets exposed. The set thickness t of the first insulator layers 82 reliably allows the first insulating material layer 82 to remain on the hard magnetic material layers 79 at the end of the etching process. The hard magnetic material layers 79, corresponding to the domain control magnetic layers 41, is thus reliably prevented from being removed during the etching process. The first insulating material layer 82 functions as protection layer for the hard magnetic material layers 79 in this manner.

Figure 9:
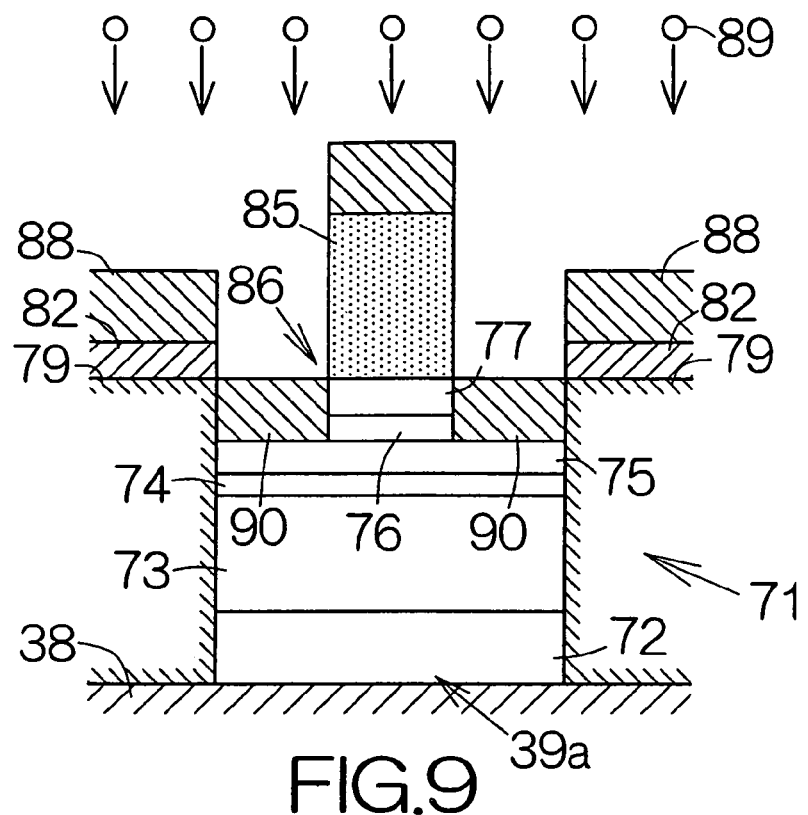
FIG. 9 is an enlarged partial sectional view of the wafer schematically illustrating the process of filling grooves, between the upper portion and the hard magnetic material layers, with insulators.

Thereafter, a second insulating material layer 88, corresponding to the second insulator layers 43, is formed on the wafer, as shown in FIG. 9. Sputtering is employed to supply insulator materials or particles 89 over the surface of the wafer from the above, for example. The grooves 87 are filled with the insulator materials 89. The insulators 90, corresponding to the insulators 58, are thus formed in the respective grooves 87. The photoresist film 85 is then removed. The top or upper surface of the upper portion 86 gets exposed.

Figure 10:
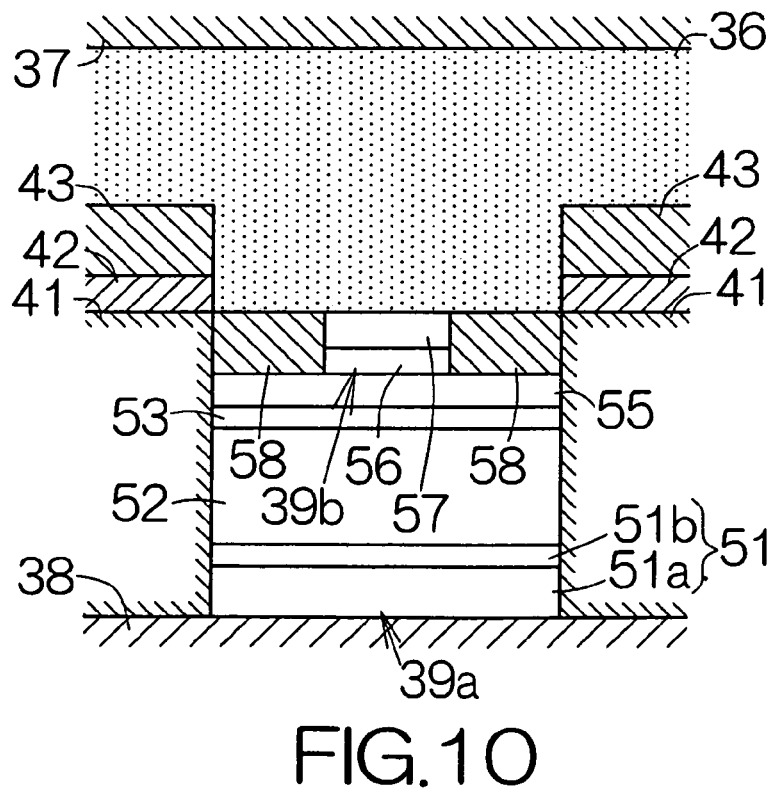
FIG. 10 is an enlarged partial sectional view of the wafer schematically illustrating the process of forming a lower magnetic pole layer of an inductive write element.

When the upper portion 86 of the layered-material 71 has been formed in the above-described manner, the hard magnetic material layers 79 and the layered-material 71 are carved into a predetermined contour based on a stripe of photoresist film, not shown. The domain control magnetic layers 41 sandwiching the magnetoresistive film 39 thus remain below the stripe of the photoresist film. An insulating film is then formed to uniformly cover over the exposed surface of the wafer. When the photoresist film is removed, the magnetoresistive film 39 and the domain control magnetic layers 41, surrounded by the insulating film, appear on the wafer. As shown in FIG. 10, the lower magnetic pole layer 36 of the inductive write element 31 is thereafter formed on the magnetoresistive film 39 and the domain control magnetic layers 41.

As conventionally known, the inductive write element 31 is subsequently formed over the CPP structure MR read element 32. The non-magnetic gap layer 37, an insulating layer containing the conductive swirly coil pattern, and the upper magnetic pole layer 35 are sequentially formed on the lower magnetic pole layer 36. When the inductive write element 31 has been embedded in the alumina layer 33, formation of the read/write electromagnetic transducer 23 is completed.

Figure 11:
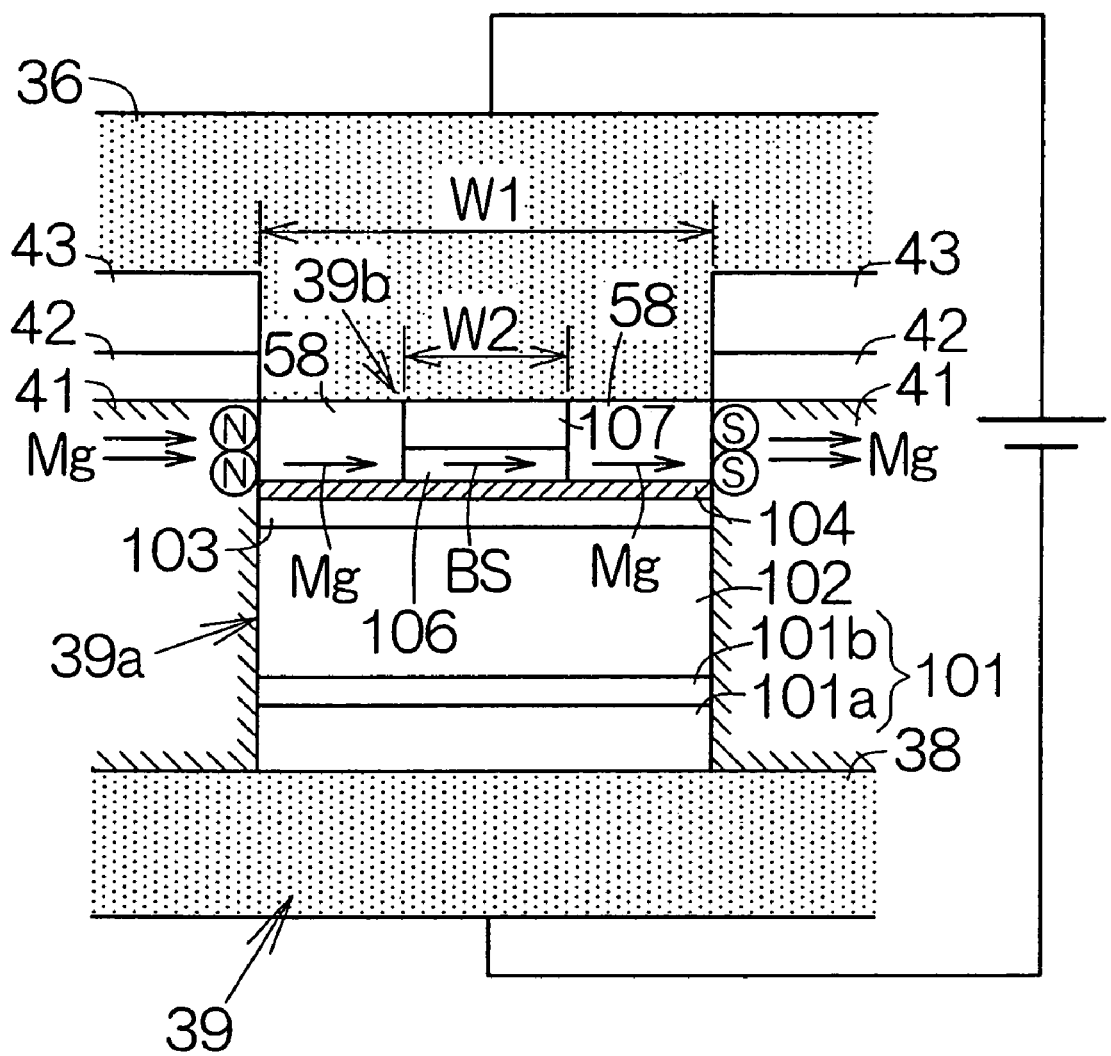
FIG. 11 is an enlarged partial front view illustrating in detail the structure of a magnetoresistive (MR) film according to another specific example.

FIG. 11 illustrates the structure of the magnetoresistive film or layered-structure 39 according to another example. The magnetoresistive film 39 is a so-called tunnel-junction film. The tunnel-junction film includes a substratum 101, an antiferromagnetic layer 102 as a pinning layer, a pinned ferromagnetic layer 103, and an insulating spacer layer 104, sequentially superposed one another, for the lower portion 39a of the magnetoresistive film 39. The tunnel-junction film further includes the upper portion 39b of the magnetoresistive film 39, including a free ferromagnetic layer 106 and a protection layer 107, superposed on the upper surface of the insulating spacer layer 104. The antiferromagnetic layer 102 serves to fix the magnetization in the pinned ferromagnetic layer 103 in a specific direction. Here, the substratum 101 may include a Ta layer 101a, and an NiFe layer 101b superposed on the upper surface of the Ta layer 101a. For example, the antiferromagnetic layer 102 may be made of an antiferromagnetic material such as FeMn, PdPtMn, or the like. The pinned ferromagnetic layer 103 as well as the free ferromagnetic layer 106 may be made of a ferromagnetic material such as $Co_{90}Fe_{10}$ or the like. The insulating spacer layer 104 may be made of a metallic oxide such as $Al_2O_3$ or the like. The protection layer 107 may include a Cu layer, and a cap layer or Ta layer formed to extend over the upper surface of the Cu layer, for example.

In the aforementioned manner, a first width W1 of the upper portion 39b in the lateral direction of a recording track is set smaller than a second width W2 of the lower portion 39a in the lateral direction in the magnetoresistive film 39. Accordingly, the lower portion 39a contacts the respective domain control magnetic layers 41 at the vertical planes PL. On the other hand, spaces are defined between the upper portion 39b and the vertical planes PL, namely, the domain control magnetic layers 41. The spaces are filled with insulators 58. The domain control magnetic layers 41 are thus allowed to sandwich the upper portion 39b of the magnetoresistive film 39 and the insulators 58 in the lateral direction of a recording track on the magnetic recording disk 13. The insulators 58 serve to establish a narrower path for an electric current between the lower portion 39a and the upper electrode layer or lower magnetic pole layer 36. The substantial width in the lateral direction can be reduced in this manner in the magnetoresistive film 39. In particular, since the high resistant layer or insulating spacer layer 104 of the tunnel-junction film serves to partition the upper and lower portions 39b, 39a from each other, the path for electric current can reliably be reduced.

When the CPP structure MR read element 32 is opposed to the surface of the magnetic recording disk 13 for reading a magnetic information data, the magnetization of the free ferromagnetic layer 56 is allowed to rotate in the tunnel-junction film in response to the inversion of the magnetic polarity applied from the magnetic recording disk 13, as conventionally known. The rotation of the magnetization in the free ferromagnetic layer 56 induces variation in the electric resistance of the tunnel-junction film. When a sensing current is supplied to the tunnel-junction film through the lower magnetic pole layer 36 and the lower electrode layer 38, a variation in voltage appears in the sensing current in response to the variation in the magnetoresistance. The variation in voltage can be utilized to detect a magnetic bit data recorded on the magnetic recording disk 13. Since a narrower path for the sensing current can be established in the tunnel-junction film in the aforementioned manner, the tunnel-junction film is allowed to exhibit a higher sensitivity to the magnetic field applied from the magnetic recording disk 13. In addition, since the free ferromagnetic layer 56 in the upper portion 39b is disposed in a space between the domain control magnetic layers 41, the free ferromagnetic layer 56 is allowed to receive the longitudinal biasing magnetic field BS enough. A single domain property can be realized in the free ferromagnetic layer 56 enough. The Barkhausen noise can be reduced.

The pinned ferromagnetic layer 53, 103 as well as the antiferromagnetic layer 52, 102 may be included in the upper portion 39b of the second width W2 in the CPP structure MR read element 32. In this case, the free ferromagnetic layer 56, 106 as well as the non-magnetic intermediate layer 54 and the insulating spacer layer 104 may be included within the lower portion 39a of the first width W1.

What is claimed is:

1. A method of making a current-perpendicular-to-the-plane structure magnetoresistive element, comprising:
   forming a magnetoresistive film on a surface of a lower electrode layer, the magnetoresistive film including a lower portion and an upper portion overlaid on the lower portion, the lower portion including at least a pinned magnetic layer, the upper portion including at least a free magnetic layer;
   forming a pair of domain control magnetic layers sandwiching the magnetoresistive film;
   forming an insulator film covering over the domain control magnetic layers; and
   subjecting the upper portion of the magnetoresistive film to an etching process so as to leave the lower portion of the magnetoresistive film.

2. The method according to claim 1, wherein said insulator film remains on the domain control magnetic layers after the etching process.

3. The method according to claim 2, wherein grooves are formed between the magnetoresistive film and the respective domain control magnetic layers based on the etching process.

4. The method according to claim 3, wherein insulators are filled in the grooves.

5. The method according to claim 4, wherein said free magnetic layer is located between the insulators.

6. The method according to claim 5, wherein said insulators are magnetic.

* * * * *